(12) United States Patent
He et al.

(10) Patent No.: US 10,879,036 B2
(45) Date of Patent: Dec. 29, 2020

(54) CHARGED PARTICLE BEAM SYSTEM, OPTO-ELECTRO SIMULTANEOUS DETECTION SYSTEM AND METHOD

(71) Applicant: Focus-eBeam Technology (Beijing) Co., Ltd., Beijing (CN)

(72) Inventors: Wei He, Beijing (CN); Shuai Li, Beijing (CN); Peng Wang, Beijing (CN)

(73) Assignee: FOCUS-EBEAM TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/741,246

(22) PCT Filed: May 10, 2017

(86) PCT No.: PCT/CN2017/083824
§ 371 (c)(1),
(2) Date: Dec. 30, 2017

(87) PCT Pub. No.: WO2018/068506
PCT Pub. Date: Apr. 19, 2018

(65) Prior Publication Data
US 2019/0287760 A1   Sep. 19, 2019

(30) Foreign Application Priority Data
Oct. 11, 2016   (CN) .......................... 2016 1 0887597

(51) Int. Cl.
*H01J 37/18* (2006.01)
*H01J 37/20* (2006.01)
(Continued)

(52) U.S. Cl.
CPC .......... *H01J 37/28* (2013.01); *G01N 23/2251* (2013.01); *G02B 21/00* (2013.01);
(Continued)

(58) Field of Classification Search
None
See application file for complete search history.

(56) References Cited

U.S. PATENT DOCUMENTS 3,346,236 A   10/1967 Hubbard
3,346,736 A   10/1967 Neuhaus
(Continued)

FOREIGN PATENT DOCUMENTS

CN   101241087 A   8/2008
CN   101545874 A   9/2009
(Continued)

OTHER PUBLICATIONS

Supplementary European Search Report in European application No. 17807686.5, dated Oct. 5, 2018.
(Continued)

*Primary Examiner* — James Choi
(74) *Attorney, Agent, or Firm* — Syncoda LLC; Feng Ma

(57) ABSTRACT

Disclosed is a charged particle beam system, which includes: a particle source, a column and a specimen chamber with a first movable vacuum window. The particle source is configured to generate a charged particle beam which impinges the specimen to be detected placed in a specimen chamber. The column includes a deflection device for deflecting the charged particle beam and a focusing device for focusing the charged particle beam. The charged particle beam system is compatible with multiple external optical systems to achieve simultaneous detection or fast-switching detection of the specimen. An opto-electro simultaneous detection system and the method are also disclosed.

18 Claims, 21 Drawing Sheets

(51) Int. Cl.

| | | |
|---|---|---|
| *H01J 37/28* | (2006.01) | |
| *G01N 23/2251* | (2018.01) | |
| *H01J 37/147* | (2006.01) | |
| *H01J 37/22* | (2006.01) | |
| *G02B 21/00* | (2006.01) | |
| *H01J 37/26* | (2006.01) | |
| *G01N 21/64* | (2006.01) | |
| *G01N 21/65* | (2006.01) | |

(52) U.S. Cl.
CPC ............ *H01J 37/147* (2013.01); *H01J 37/18* (2013.01); *H01J 37/20* (2013.01); *H01J 37/228* (2013.01); *H01J 37/26* (2013.01); *G01N 21/6458* (2013.01); *G01N 21/65* (2013.01); *H01J 2237/04922* (2013.01); *H01J 2237/182* (2013.01); *H01J 2237/2006* (2013.01); *H01J 2237/24475* (2013.01)

(56) References Cited

U.S. PATENT DOCUMENTS

| | | | |
|---|---|---|---|
| 4,349,242 A | 9/1982 | Ogura | |
| 4,440,475 A | 4/1984 | Colliaux | |
| 4,537,477 A | 8/1985 | Takagi | |
| 7,671,333 B2 | 3/2010 | Agronskaja | |
| 8,093,558 B2 | 1/2012 | Buijsse | |
| 8,143,600 B2 | 3/2012 | Seibel | |
| 8,368,035 B2 | 2/2013 | Seibel | |
| 8,507,854 B2 | 8/2013 | Buehler | |
| 8,658,974 B2 | 2/2014 | Buijsse | |
| 9,466,460 B2 | 10/2016 | Ominami et al. | |
| 2004/0217297 A1* | 11/2004 | Moses | H01J 37/20 250/441.11 |
| 2006/0060259 A1* | 3/2006 | Devitt | B25B 11/005 141/65 |
| 2008/0210869 A1 | 9/2008 | Gerritsen | |
| 2009/0208072 A1 | 8/2009 | Seibel | |
| 2009/0242763 A1 | 10/2009 | Buijsse | |
| 2010/0224780 A1 | 9/2010 | Spruck | |
| 2011/0079711 A1 | 4/2011 | Buehler | |
| 2011/0226949 A1* | 9/2011 | Zeidler | H01J 37/09 250/310 |
| 2012/0091338 A1 | 4/2012 | Buijsse | |
| 2012/0145926 A1 | 6/2012 | Seibel | |
| 2012/0298864 A1* | 11/2012 | Morishita | H01J 37/244 250/310 |
| 2015/0228448 A1 | 8/2015 | Ominami et al. | |
| 2016/0126058 A1 | 5/2016 | Ominami et al. | |
| 2018/0158645 A1* | 6/2018 | Cho | H01J 37/20 |

FOREIGN PATENT DOCUMENTS

| | | | | |
|---|---|---|---|---|
| CN | 101964294 A | | 2/2011 | |
| CN | 102007369 A | | 4/2011 | |
| CN | 104142302 A | | 11/2014 | |
| CN | 105247650 A | | 1/2016 | |
| CN | 106525845 A | | 3/2017 | |
| GB | 1213527 A | | 11/1970 | |
| JP | S5532304 A | | 3/1980 | |
| JP | H0729881 A | | 1/1995 | |
| JP | H09129169 A | | 5/1997 | |
| JP | 2012028019 A | * | 2/2012 | ............ H01J 37/023 |
| WO | 2016036250 A1 | | 3/2016 | |
| WO | WO-2016036250 A1 | * | 3/2016 | ............. H01J 37/28 |

OTHER PUBLICATIONS

A.C. Zonnevylle et al: "Integration of a high-NA light microscope in a scanning electron microscope", Journal of Microscope, Jul. 25, 2013(Jul. 25, 2013), pp. n/a-n/a, XP055079052,ISSN: 0022-2720, DOI: 10.1111/jmi.12071* the whole document*.

International Search Report in international application No. PCT/CN2017/083824, dated Aug. 21, 2017.

English Translation of Written Opinion of the International Search Authority in international application No. PCT/CN2017/083824, dated Aug. 21, 2017.

First Office Action of the European application No. 17807686.5, dated Feb. 6, 2020.

* cited by examiner

CHARGED PARTICLE BEAM SYSTEM, OPTO-ELECTRO SIMULTANEOUS DETECTION SYSTEM AND METHOD

TECHNICAL FIELD

The present disclosure relates to the field of photoelectric information technology, and in particular to a charged particle beam system, as well as an opto-electro simultaneous detection system and method.

BACKGROUND

The traditional optical detection system is popular for its convenience of operation; especially for traditional optical microscope (OM), its specimen preparation is easy, and the detection can be carried out in an ambient environment without a strict observation condition such as high vacuum. With the development of the optical technology, various optical systems (apparatus) other than the traditional OM have emerged, such as Fluorescence Microscope, Confocal Microscope, Two(multi)-photon Microscope, Raman spectrometer, and Ultra-short pulse laser for studying the nonlinear optical properties, and etc.

Due to the low resolution of the traditional optical system, a charged particle beam system is often used in combination with the optical system to achieve higher resolution detection. The charged particle beam system refers to several high precision instruments for observing or fabricating microscopic objects, including: Scanning Electron Microscope (SEM), Transmission Electron Microscope (TEM), Scanning Transmission Electron Microscope (STEM), and Focused Ion Beam (FIB) and etc. Charged particles in the charged particle system are usually accelerated and thus have very high energy. According to the De Broglie's Theory, the wavelength of the accelerated particles with high energy is shorter than the wavelength of the optical wave, and therefore a higher resolution image will be achieved with the charged particle beam system based on the relationship of the imaging resolution with the diffraction. Therefore, the charged particle beam system is widely used in the field of energy exploration, material science and biology science and etc.

When the optical system and the charged particle beam system are used in combination to perform observation, since the resolution of the optical system is generally 200 nm, one can firstly use the optical system to find a target position and then use the charged particle beam system to perform detection at a high resolution, thus achieving the high resolution image of the target. However, the specimen can be easily changed or damaged during transfer, storage, and treatment. In addition, the relocation of the specimen is also a problem.

Therefore, an observation system combining the optical system and the charged particle beam system is in need to achieve synchronous detection or fast switching detection, overcome the disadvantages of independent detections by the optical system and the charged particle beam system and improve the detection efficiency. However, the existing solution to this is putting all or part of optical structure elements (e.g., optical lenses) of the optical system in the vacuum specimen chamber of the charged particle beam system, or integrating all or part of optical structure elements (e.g., optical lenses) of the optical system and the electron microscope of the charged particle beam system into a box-type device. However, in this way, as the optical structure elements of the optical system is put into the vacuum specimen chamber, the structure of the whole system is complex, the operation is inconvenient and it becomes difficult to be compatible with multiple optical systems to perform simultaneous detection.

SUMMARY

In view of this, embodiments according to the disclosure provide a charged particle system, an opto-electro simultaneous detection system and method, to achieve the synchronous or fast-switching detection compatible with multiple optical systems.

A technical solution according to an embodiment herein may be implemented as follows.

According to an embodiment of the disclosure, a charged particle system is provided, which includes: a particle source, a column and a specimen chamber with a first window. The particle source is configured to generate a charged particle beam for impinging a specimen to be detected placed in the specimen chamber. The column comprises a deflecting device for deflecting the charged particle beam and a focusing device for focusing the charged particle beam.

In an embodiment, the charged particle beam system further comprises a dynamic sealing device for connecting the first vacuum window and an outer wall of the specimen chamber.

In an embodiment, the charged particle beam system further comprises a first displacement device connected to the first vacuum window to adjust a position of the first vacuum window.

In an embodiment, the charged particle beam system further comprises a specimen holder for supporting the specimen.

In an embodiment, the charged particle beam system further comprises a movement control device for translating or overturning the specimen holder.

In an embodiment, a second vacuum window is deployed on a sidewall of the column, and is configured to introduce an external optical beam to the column.

In an embodiment, the charged particle beam system further comprises a first reflecting mirror with a hole at a center of the first reflecting mirror and located on the optical axis of the system, wherein an angle between the first reflecting mirror and the optical axis is 45°; and the charged particle beam passes through the hole before impinging the specimen.

In an embodiment, the charged particle beam system further comprises a second reflecting mirror with a hole at a center of the second reflecting mirror, the second mirror can rotate about a fixed axis, when an angle between the second vacuum mirror and the optical axis is 90°, the charged particle beam can pass through the hole and impinge the specimen.

In an embodiment, a rotation axis of the movement control device perpendicularly intersects with an optical axis of the system.

In an embodiment, the specimen holder is a transparent and uniform thin plate with or without an array of holes.

In an embodiment, the charged particle beam system further comprises a second charged particle detector or a back scattered charged particle detector located under the column; or a movable scanning transmission charged particle detector located under the specimen to be detected.

In an embodiment, a third window or a pressure limiting aperture is deployed at bottom of the column, and is configured to maintain a pressure difference between the column and the specimen chamber.

An embodiment of the disclosure provides an opto-electro simultaneous detection system, which includes a charged particle beam system as described above and an optical system, located outside the specimen chamber of the charged particle beam system, wherein the optical system detects the specimen through the first vacuum window.

An embodiment of the disclosure provides opto-electro simultaneous detection method, which includes: a first optical system introduces an optical beam into or out of a specimen chamber through a first vacuum window, as an optical beam propagation channel, at bottom of the specimen chamber, to carry out a first detection of a specimen; and a charged particle beam system generates a charged particle beam, which is deflected and focused the then impinges the specimen, and adjusting at least one of a position of the first vacuum window and a position of the specimen, to carry out a second detection of the specimen.

In an embodiment, each the first detection and the second detection comprises: positioning, measurement, scanning, imaging, and fabrication of the specimen.

In an embodiment, after the first detection of the specimen with the first optical system, the method further includes: a movement control device connected to the specimen holder overturns a specimen holder, such that the specimen is rotated by an angle of 180° about a rotation axis of the movement control device and a second detection center after the overturn coincides with a first detection center before the overturn.

In an embodiment, the method further includes: a second optical system generates an optical beam, which enters a column of the charged particle beam system through a second vacuum window on a side wall of the column, and is then deflected by a second reflecting mirror to impinge the specimen, to fabricate the specimen.

In an embodiment, impinging the specimen by the charged particle beam comprises: impinging the specimen with the charged particle beam passing through a hole at a center of the first reflecting mirror located at an optical axis of the charged particle system; wherein an angle between the first reflecting mirror and the optical axis is 45°.

In an embodiment, the method further includes: the optical beam generated by the first optical system enters a column of the charged particle beam system through a second vacuum window on a side wall of the column and then to be deflected by the first reflecting mirror to impinge the specimen, so as to illuminate the specimen.

In an embodiment, impinging the specimen by the charged particle beam includes: the charged particle beam passing through a hole at a center of the second reflecting mirror located at an optical axis of the charged particle system impinges the specimen; wherein an angle between the second reflecting mirror and the optical axis is 90°.

According to embodiments of the disclosure, the charged particle beam generated from the charged particle beam system impinge the specimen to achieve the fabrication and imaging of the specimen; the optical beam generated from the optical system passes through the vacuum window at the bottom of the specimen chamber of the charged particle beam system and illuminate the specimen to achieve the positioning, scanning, imaging and measurement, and etc.; therefore, multiple optical systems can be used to implement the detection through the vacuum window at the bottom of the specimen chamber; at the same time, the charged particle beam generated from the charged particle beam system can impinge the specimen from the top of the specimen chamber to implement the detection, in this way the opto-electro simultaneous detection can be achieved.

For the charged particle beam system, a specimen holder can be installed in the specimen chamber, the specimen holder is connected to a movement control device, to translate and rotate the specimen holder, thus achieving a fast switching between specimens detections with the optical system and with the charged particle beam system.

DETAILED DESCRIPTION

The details are described as follows with reference to the figures and several embodiments.

Embodiment 1

Figure 1:
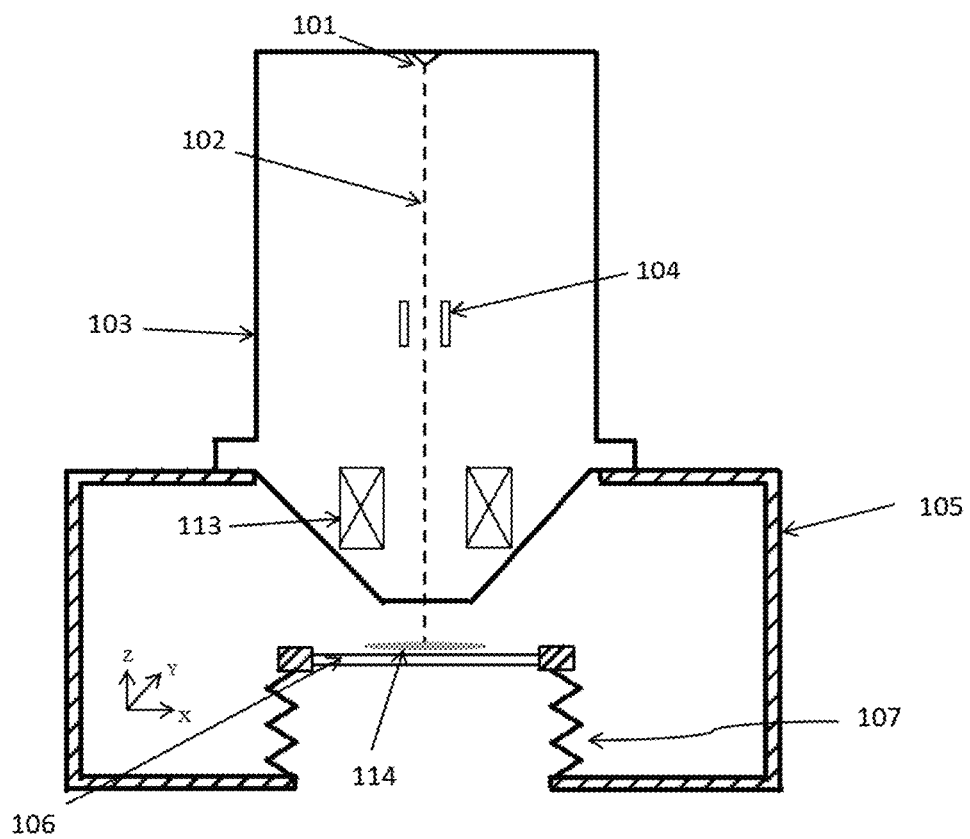
FIG. 1 is a diagram of a charged particle beam system according to Embodiment 1 of the disclosure.

FIG. 1 is a diagram of a charged particle beam system according to embodiment 1 of the disclosure. The charged particle beam system includes a particle source 101, a column 103, a specimen chamber 105 with a first vacuum window 106, and a dynamic sealing device 107.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

According to an embodiment of the disclosure, the first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers; in addition, the first vacuum window 106 is preferably made of silicon nitride or silicon dioxide.

According to an embodiment of the disclosure, the specimen 114 may be directly put on the first vacuum window 106; the charged particle beam generated from the charged particle beam system is deflected by the deflection device 104 and focused by the focusing device 113, and then the specimen detection may be realized with the charged particle beam system. The column 103 may be an electron-optics column or an ion-optics column.

Embodiment 2

Figure 2:
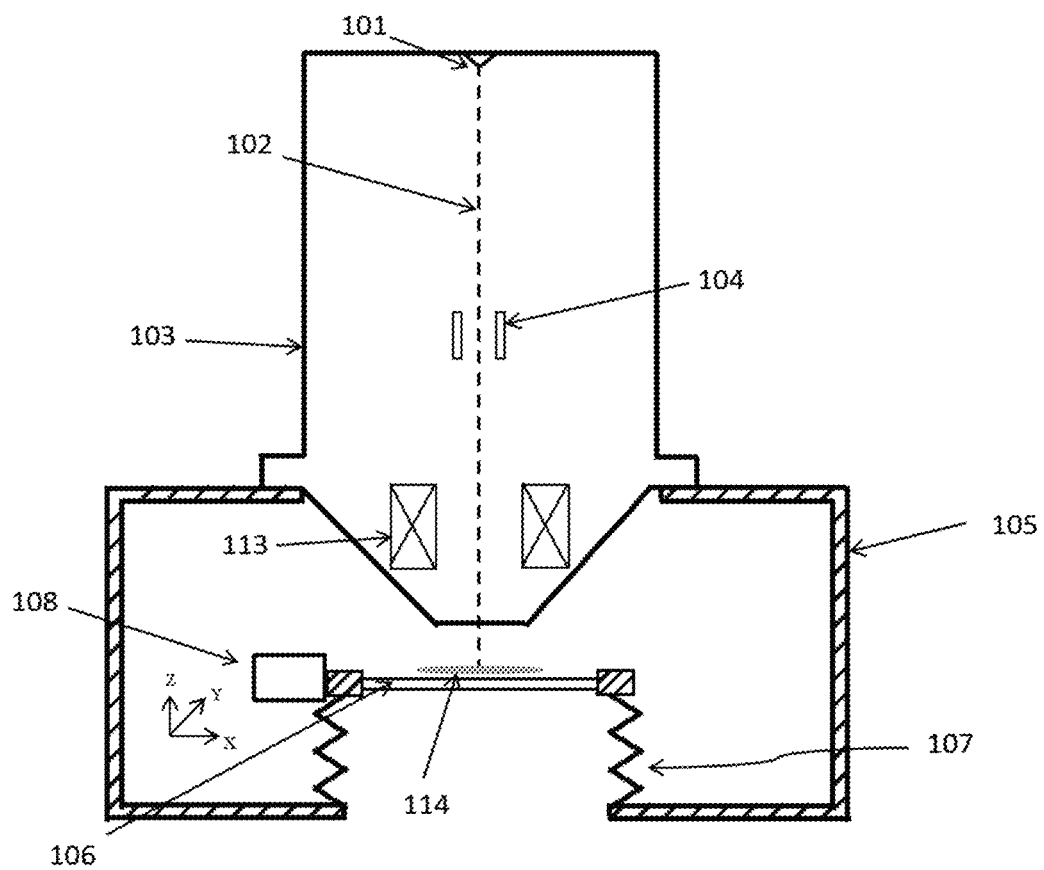
FIG. 2 is a diagram of a charged particle beam system according to Embodiment 2 of the disclosure.

FIG. 2 is a diagram of a charged particle beam system according to embodiment 2 of the disclosure. The charged particle beam system includes a particle source 101, a column 103, a specimen chamber 105 with a first vacuum window 106, a dynamic sealing device 107 and a first displacement device 108.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

The first displacement device 108 is configured to control the displacement of the first vacuum window.

According to an embodiment of the disclosure, the first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers; in addition, the first vacuum window 106 is preferably made of silicon nitride or silicon dioxide.

According to an embodiment of the disclosure, the first displacement device 108 may be a 3-dimension displacement platform.

According to an embodiment of the disclosure, the specimen 114 may be directly put on the first window 106; the charged particle beam generated from the charged particle system is deflected by the deflection device 104 and focused by the focusing device 113, the specimen 114 is moved under control of the first displacement device 108 and then the specimen detection may be realized with the charged particle beam system. The column 103 may be an electron-optics column or an ion-optics column.

Embodiment 3

Figure 3:
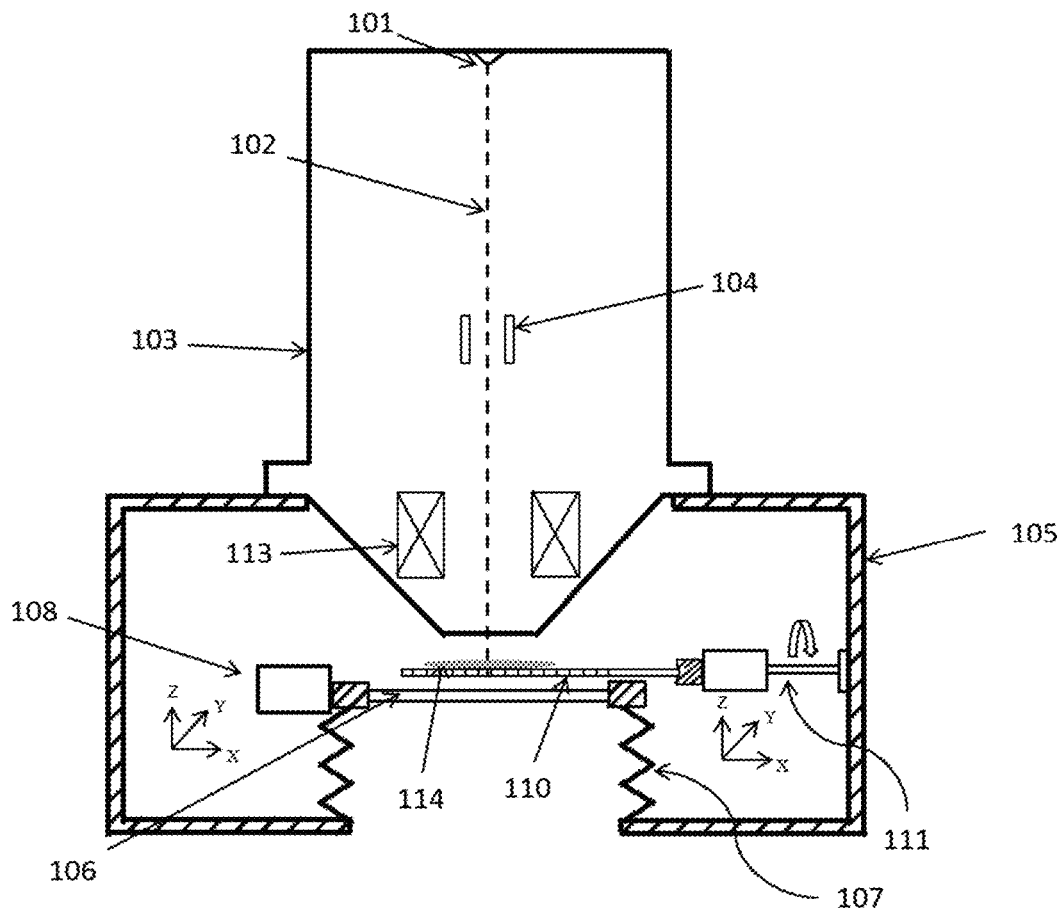
FIG. 3 is a diagram of a charged particle beam system according to Embodiment 3 of the disclosure.

FIG. 3 is a diagram of a charged particle beam system according to embodiment 3 of the disclosure. The charged particle beam system includes a particle source 101, a column 103, a specimen chamber 105 with a first vacuum window 106, a dynamic sealing device 107, a first displacement device 108, a specimen holder 110 and a movement control device 111.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

The first displacement device 108 is configured to control the displacement of the first vacuum window.

The specimen holder 110 is configured to hold the specimen 114.

The movement control device 111 is configured to translate and rotate the specimen holder 110.

According to an embodiment of the disclosure, the first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers; in addition, the first vacuum window 106 is preferably made of silicon nitride or silicon dioxide.

According to an embodiment of the disclosure, the first displacement device 108 may be a 3-dimension displacement platform.

According to an embodiment of the disclosure, the dynamic sealing device 107 preferably has a structure of a metal bellows.

Figure 4A:
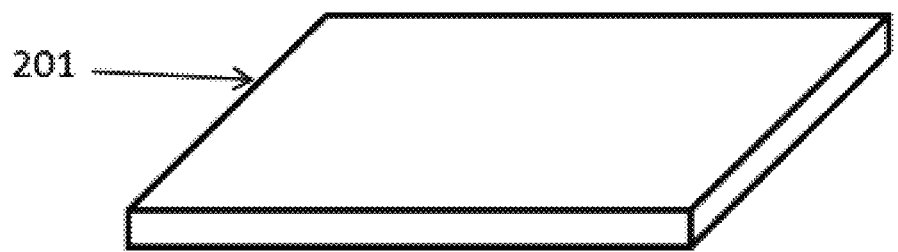
FIG. 4A is a diagram of a specimen holder according to an embodiment of the disclosure.
Figure 4B:
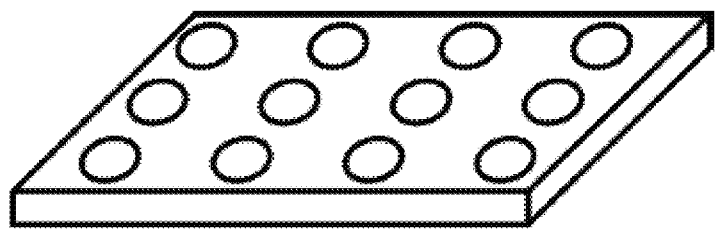
FIG. 4B is a diagram of a specimen holder of another type according to an embodiment of the disclosure.

According to an embodiment of the disclosure, FIG. 4A is a diagram of the structure of the specimen holder, which may be a uniform transparent thin plate; another structure of the specimen holder is shown in FIG. 4B, which is in a form of a thin plate with an array of holes, and the shape of the holes may be, but is not limited to, circle or rectangle; the specimen 110 is preferably made of silicon nitride or silicon dioxide; in order to shorten the working distance (WD) of the optical system and to be compatible with optical objective lens of large magnification, the preferred thickness of the specimen holder 110 is 100 micrometers to 500 micrometers, the more preferred thickness is 1 micrometer to 100 micrometers, the most preferred thickness is 500 nanometers to 1 micrometer.

Figure 5A:
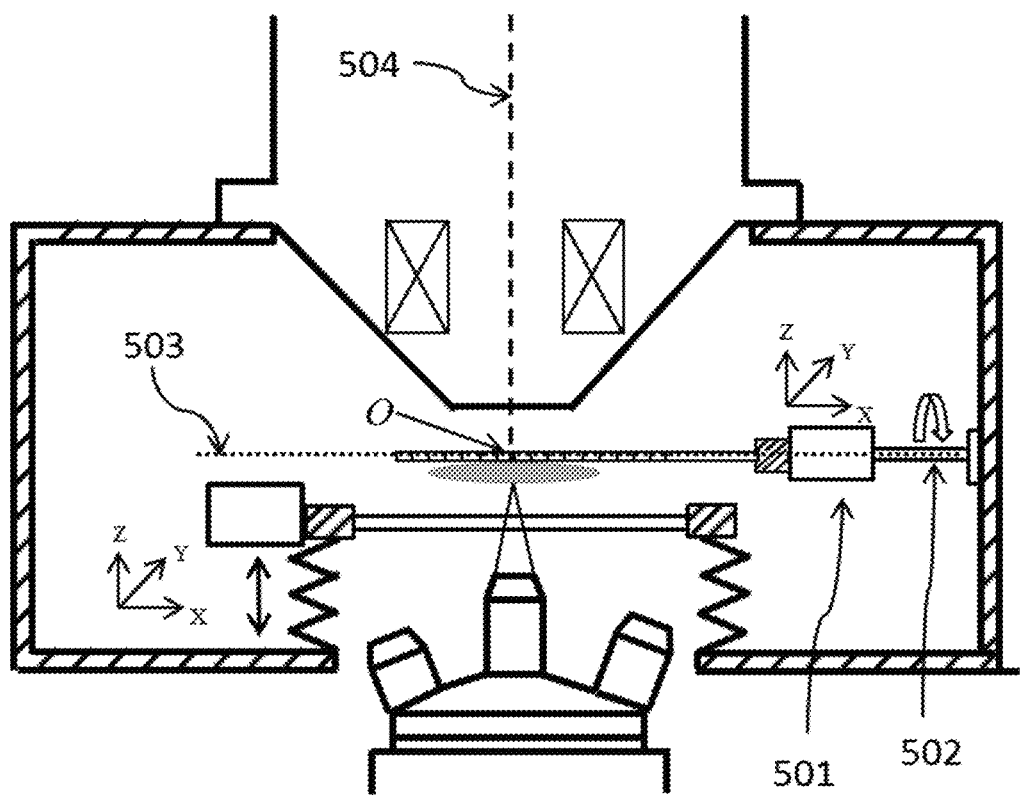
FIG. 5A is a diagram of a charged particle beam system before overturn of a specimen according to an embodiment of the disclosure.
Figure 5B:
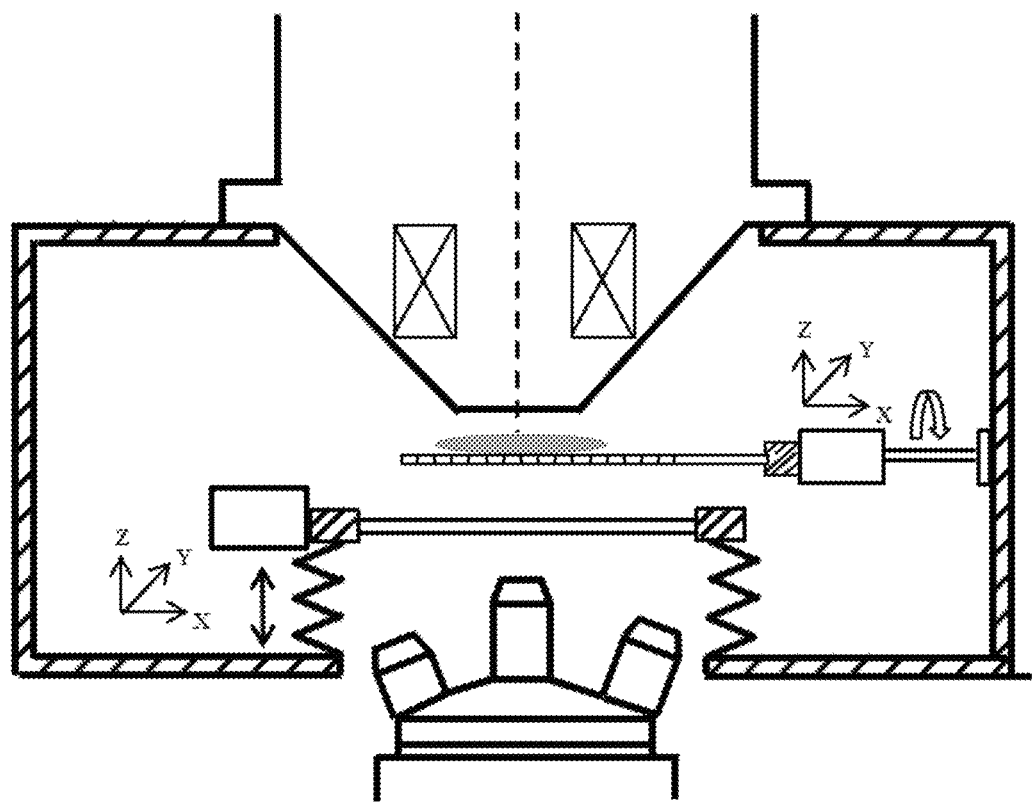
FIG. 5B is a diagram of the charged particle beam system after overturn of the specimen according to an embodiment of the disclosure.

According to an embodiment of the disclosure shown in FIG. 5, the movement control device 111 may include a 3-dimension control platform 501 to translate the specimen holder 110, and a rotation device 502 to rotate the specimen holder; a rotation axis 503 of the rotation device 502 intersects perpendicularly with the optical axis 504 of the charged particle beam system at point O; in this way, the optical observation center before overturn of the specimen holder 110 coincides with the charged particle observation center after the overturn; when it comes to thick and opaque specimen, the charged particle beam system can only image the upper surface of the specimen, while the optical system cannot image the upper surface at the same time. In this case, the detection process is as follows: as shown in FIG. 5A, firstly, the specimen holder is overturned, such that the specimen is placed below the specimen holder, and the specimen is detected by the traditional optical system, such as the optical microscope, to find the target position; secondly, after the target position is found, as shown in FIG. 5B, the specimen is rotated by 180 degree using the rotation device 502; and then, the specimen is detected with the charged particle beam system; thereby, the fast switching detection of the thick or opaque specimen between the traditional optical system and the charged particle beam system can be realized.

Embodiment 4

Figure 6:
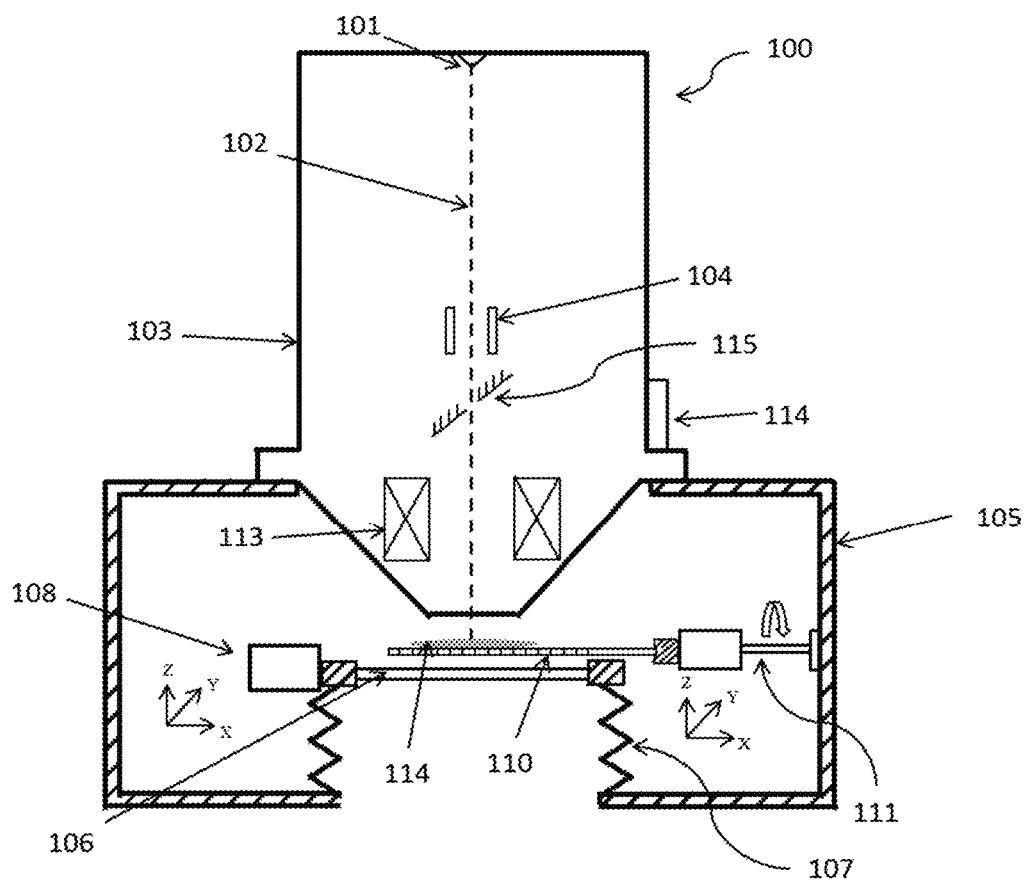
FIG. 6 is a diagram of a charged particle beam system according to Embodiment 4 of the disclosure.

FIG. 6 is a diagram of a charged particle beam system according to embodiment 4 of the disclosure. The charged particle beam system includes a particle source 101, a column 103, a specimen chamber 105 with a first window 106, a dynamic sealing device 107, a first displacement device 108, a specimen holder 110, a movement control device 111, a second vacuum window 114 and a first reflecting mirror 115.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

The first displacement device 108 is configured to control the displacement of the first vacuum window.

The specimen holder 110 is configured to hold the specimen 114.

The movement control device 111 is configured to translate and rotate the specimen holder 110.

The second vacuum window 114 is configured to introduce an optical beam to the column 103 from outside of the charged particle beam system.

The first reflecting mirror 115 is configured to reflect the optical beam entering from the second vacuum window 114, such that the optical beam, after being reflected by the first reflecting mirror 115 impinges the specimen to result in a transmission type of illumination.

According to an embodiment of the disclosure, there is a hole at the center of the first reflecting mirror, and the first reflecting mirror has an angle of 45° with the optical axis of the system; and the charged particle beam can pass through the hole before impinging the specimen.

In the embodiment of the disclosure, the reference sign 102 denotes the optical axis of the charged particle beam system.

The first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers.

According to an embodiment of the disclosure, the first displacement device 108 may be a 3-dimension displacement platform.

According to an embodiment of the disclosure, the dynamic sealing device 107 preferably has a structure of a metal bellows.

According to an embodiment of the disclosure, the movement control device 111 may include a 3-dimension control platform to translate the specimen holder 110, and a rotation device to rotate the specimen holder; a rotation axis of the movement control device 111 intersects perpendicularly with the optical axis of the charged particle beam system; in this way, the optical observation center before overturn of the specimen holder 110 coincides with the charged particle observation center after the overturn.

According to an embodiment of the disclosure, FIG. 4A is a diagram of the structure of the specimen holder, which may be a uniform transparent thin plate; another structure of the specimen holder is shown in FIG. 4B, which is in a form of a thin plate with an array of holes, and the shape of the holes may be, but is not limited to, circle or rectangle; the specimen 110 is preferably made of silicon nitride or silicon dioxide; in order to shorten the working distance (WD) of the optical system and to be compatible with optical objective lens of large magnification, the preferred thickness of the specimen holder 110 is 100 micrometers to 500 micrometers, the more preferred thickness is 1 micrometer to 100 micrometers, the most preferred thickness is 500 nanometers to 1 micrometer.

According to an embodiment of the disclosure shown in FIG. 5, the movement control device 111 may include a 3-dimension control platform 501 to translate the specimen holder 110, and a rotation device 502 to rotate the specimen holder; a rotation axis 503 of the rotation device 502 intersects perpendicularly with the optical axis 504 of the charged particle beam system at point O; in this way, the optical observation center before overturn of the specimen holder 110 coincides with the charged particle observation center after the overturn; when it comes to thick and opaque specimen, the charged particle beam system can only image the upper surface of the specimen, while the optical system cannot image the upper surface at the same time. In this case, the detection process is as follows: as shown in FIG. 5A, firstly, the specimen holder is overturned, such that the specimen is placed below the specimen holder, and the specimen is detected by the traditional optical system, such as the optical microscope, to find the target position; secondly, after the target position is found, as shown in FIG. 5B, the specimen is rotated by 180 degree using the rotation device 502; and then, the specimen is detected with the charged particle beam system; thereby, the fast switching detection of the thick or opaque specimen between the traditional optical system and the charged particle beam system can be realized.

Embodiment 5

Figure 7:
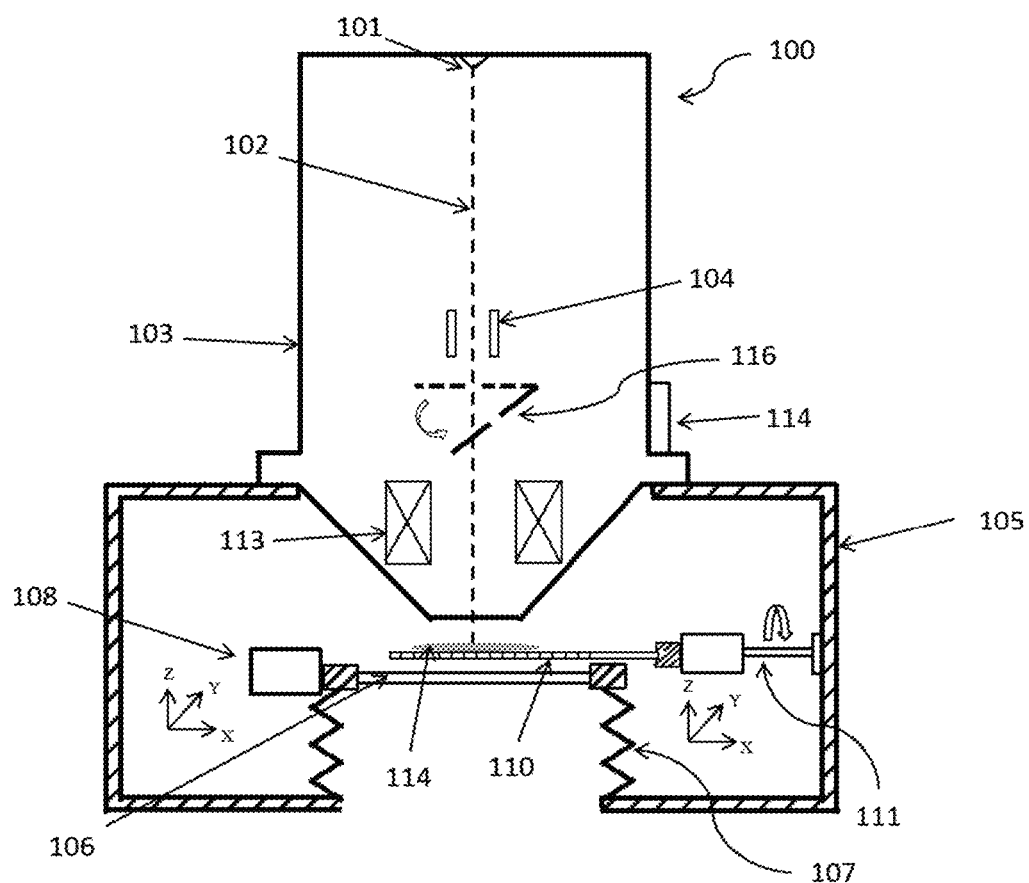
FIG. 7 is a diagram of a charged particle beam system according to Embodiment 5 of the disclosure.

FIG. 7 is a diagram of a charged particle beam system according to embodiment 5 of the disclosure. The charged particle beam system includes a particle source 101, a column 103, a specimen chamber 105 with a first vacuum window 106, a dynamic sealing device 107, a first displacement device 108, a specimen holder 110, a movement control device 111, a second vacuum window 114 and a second reflecting mirror 116.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

The first displacement device 108 is configured to control the displacement of the first vacuum window.

The specimen holder 110 is configured to hold the specimen 114.

The movement control device 111 is configured to translate and rotate the specimen holder 110.

The second vacuum window 114 is configured to introduce an optical beam to the column 103 from outside of the charged particle beam system.

The second reflecting mirror 116 is configured to reflect the optical beam entering from the second vacuum window 114, such that the optical beam, after being reflected by the first reflecting mirror 115 impinges the specimen to perform operations such as fabricating the specimen.

According to an embodiment of the disclosure, there is a hole at the center of the second reflecting mirror 116, and the second reflecting mirror is located on the optical axis of the system; when the angle between the mirror and the optical axis is 90° (shown with dashed line), the charged particle beam can pass through the hole; when the angle between the mirror and the optical axis is 45° (shown with solid line), the optical beam introduced from the second vacuum window is reflected by the mirror and impinges the specimen.

In the embodiment of the disclosure, the reference sign 102 denotes the optical axis of the charged particle beam system.

The first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers.

According to an embodiment of the disclosure, the first displacement device 108 may be a 3-dimension displacement platform.

According to an embodiment of the disclosure, the dynamic sealing device 107 preferably has a structure of a metal bellows.

According to an embodiment of the disclosure, the movement control device 111 may include a 3-dimension control platform to translate the specimen holder 110, and a rotation device to rotate the specimen holder; a rotation axis of the movement control device 111 intersects perpendicularly with the optical axis of the charged particle beam system; in this way, the optical observation center before overturn of the specimen holder 110 coincides with the charged particle observation center after the overturn.

According to an embodiment of the disclosure, FIG. 4A is a diagram of the structure of the specimen holder, which may be a uniform transparent thin plate; another structure of the specimen holder is shown in FIG. 4B, which is in a form of a thin plate with an array of holes, and the shape of the holes may be, but is not limited to, circle or rectangle; the specimen 110 is preferably made of silicon nitride or silicon dioxide; in order to shorten the working distance (WD) of the optical system and to be compatible with optical objective lens of large magnification, the preferred thickness of the specimen holder 110 is 100 micrometers to 500 micrometers, the more preferred thickness is 1 micrometer to 100 micrometers, the most preferred thickness is 500 nanometers to 1 micrometer.

According to an embodiment of the disclosure shown in FIG. 5, the movement control device 111 may include a 3-dimension control platform 501 to translate the specimen holder 110, and a rotation device 502 to rotate the specimen holder; a rotation axis 503 of the rotation device 502 intersects perpendicularly with the optical axis 504 of the charged particle beam system at point O; in this way, the optical observation center before overturn of the specimen holder 110 coincides with the charged particle observation center after the overturn; when it comes to thick and opaque specimen, the charged particle beam system can only image the upper surface of the specimen, while the optical system cannot image the upper surface at the same time. In this case, the detection process is as follows: as shown in FIG. 5A, firstly, the specimen holder is overturned, such that the specimen is placed below the specimen holder, and the specimen is detected by the traditional optical system, such as the optical microscope, to find the target position; secondly, after the target position is found, as shown in FIG. 5B, the specimen is rotated by 180 degree using the rotation device 502; and then, the specimen is detected with the charged particle beam system; thereby, the fast switching detection of the thick or opaque specimen between the traditional optical system and the charged particle beam system can be realized.

Embodiment 6

Figure 8:
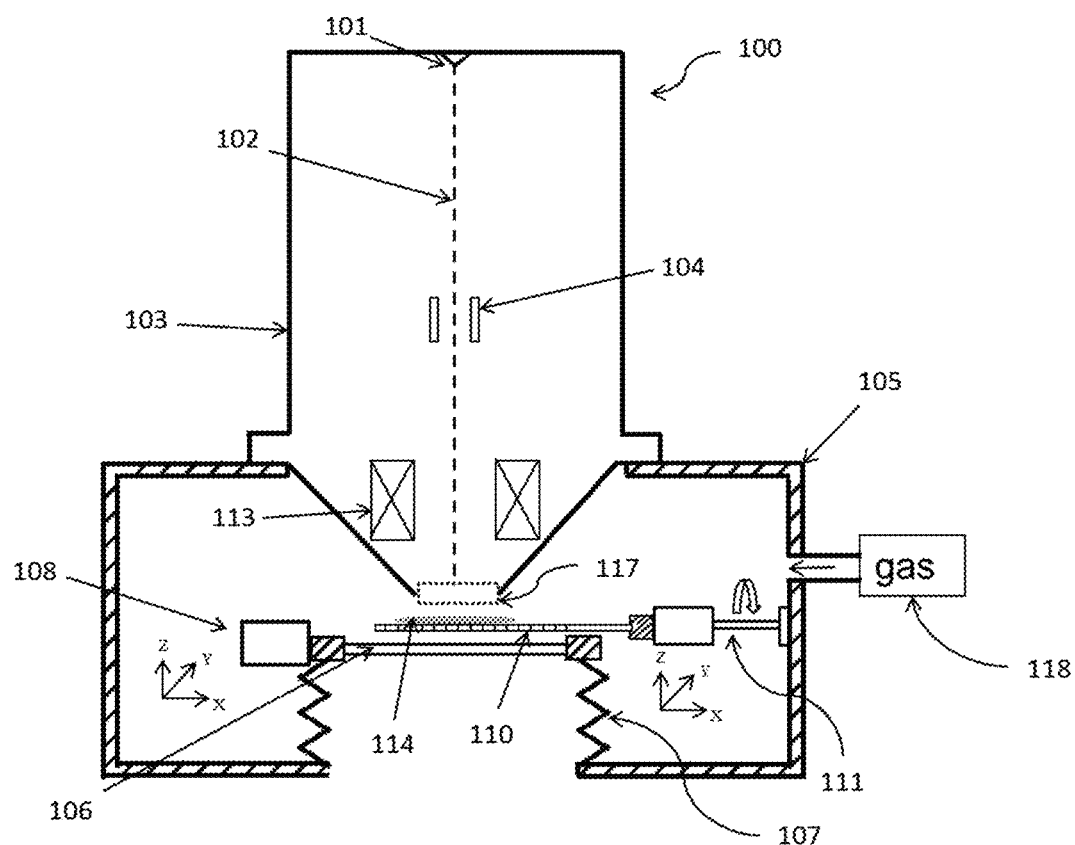
FIG. 8 is a diagram of a charged particle beam system according to Embodiment 6 of the disclosure.

FIG. 8 is a diagram of a charged particle beam system according to embodiment 6 of the disclosure. The charged particle beam system includes a particle source 101, a column 103, a specimen chamber 105 with a first window 106, a dynamic sealing device 107, a first displacement device 108, a specimen holder 110, a movement control device 111, a column separation device 117 and a gas supplying system 118.

The particle source 101 is configured to generate a charged particle beam 102 for impinging the specimen 114 located in the specimen chamber 105 to achieve the detection of the specimen.

The column 103 includes a deflection device 104 to deflect the charged particle beam and a focusing device 113 to focus the charged particle beam.

The focusing device 113 may be an electromagnetic lens.

The dynamic sealing device 107 is configured to connect the first vacuum window 106 and the outside wall of the specimen chamber 105. Preferably, the dynamic sealing device 107 has a structure of a metal bellows.

The first displacement device 108 is configured to control the displacement of the first vacuum window.

The specimen holder 110 is configured to hold the specimen 114.

The movement control device 111 is configured to translate and rotate the specimen holder 110.

The column separation device 117 is located at the bottom of the column 103 and is used to separate the column;

The gas supplying system 118 is configured to supply gas to the specimen chamber 105, the supplied gas includes at least one of: helium gas (He), hydrogen gas ($H_2$), nitrogen gas ($N_2$), oxygen gas ($O_2$), water vapour, or a mixture of the above.

The first vacuum window 106 is an ultrathin transparent vacuum window, a preferred thickness of which is 1 millimeter to 5 millimeters, a more preferred thickness is 100 micrometers to 1 millimeter, and the most preferred thickness is 50 micrometers to 100 micrometers.

According to an embodiment of the disclosure, the first displacement device 108 may be a 3-dimension displacement platform.

According to an embodiment of the disclosure, the dynamic sealing device 107 preferably has a structure of a metal bellows.

According to an embodiment of the disclosure, the movement control device 111 may include a 3-dimension control platform to translate the specimen holder 110, and a rotation device to rotate the specimen holder; a rotation axis of the movement control device 111 intersects perpendicularly with the optical axis of the charged particle beam system; in this way, the optical observation center before overturn of the specimen holder 110 coincides with the charged particle observation center after the overturn.

According to an embodiment of the disclosure, FIG. 4A is a diagram of the structure of the specimen holder, which may be a uniform transparent thin plate; another structure of the specimen holder is shown in FIG. 4B, which is in a form of a thin plate with an array of holes, and the shape of the holes may be, but is not limited to, circle or rectangle; the specimen 110 is preferably made of silicon nitride or silicon dioxide; in order to shorten the working distance (WD) of the optical system and to be compatible with optical objective lens of large magnification, the preferred thickness of the specimen holder 110 is 100 micrometers to 500 micrometers, the more preferred thickness is 1 micrometer to 100 micrometers, the most preferred thickness is 500 nanometers to 1 micrometer.

According to an embodiment of the disclosure shown in FIG. 5, the movement control device 111 may include a 3-dimension control platform 501 to translate the specimen holder 110, and a rotation device 502 to rotate the specimen holder; a rotation axis 503 of the rotation device 502 intersects perpendicularly with the optical axis 504 of the charged particle beam system at point O; in this way, the optical observation center before overturn of the specimen holder 110 coincides with the charged particle observation center after the overturn; when it comes to thick and opaque specimen, the charged particle beam system can only image the upper surface of the specimen, while the optical system cannot image the upper surface at the same time. In this case, the detection process is as follows: as shown in FIG. 5A, firstly, the specimen holder is overturned, such that the specimen is placed below the specimen holder, and the specimen is detected by the traditional optical system, such as the optical microscope, to find the target position; secondly, after the target position is found, as shown in FIG. 5B, the specimen is rotated by 180 degree using the rotation device 502; and then, the specimen is detected with the charged particle beam system; thereby, the fast switching detection of the thick or opaque specimen between the traditional optical system and the charged particle beam system can be realized.

Figure 9A:
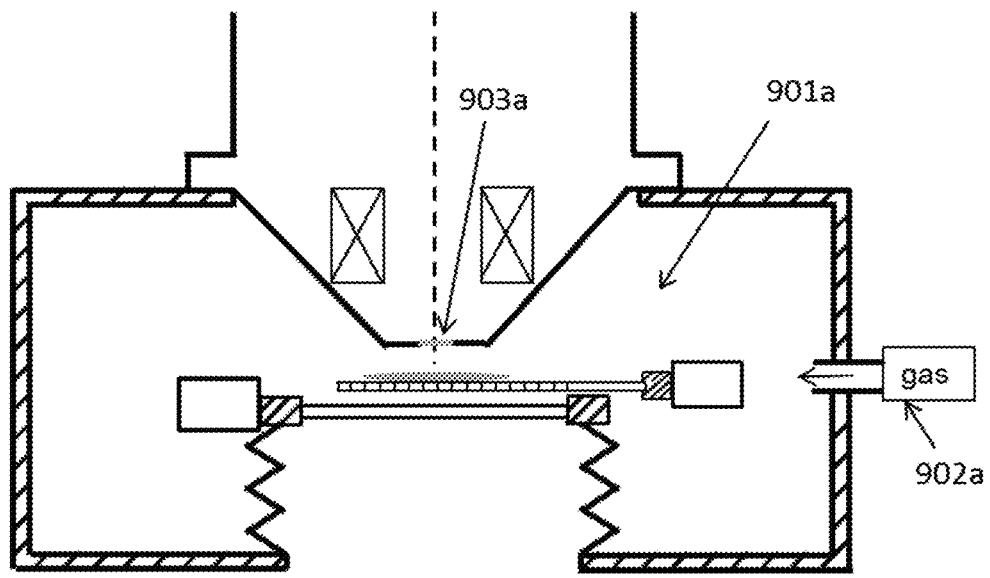
FIG. 9A is a diagram of a column separating unit according to Embodiment 6 of the disclosure.
Figure 9B:
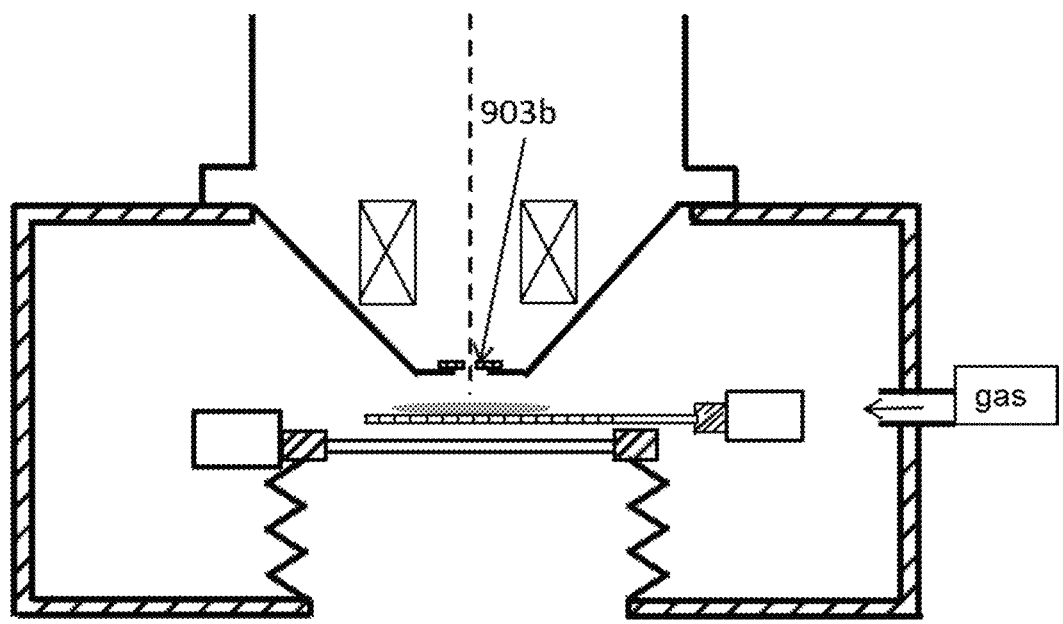
FIG. 9B is another diagram of the column separating unit according to Embodiment 6 of the disclosure.

According to an embodiment of the disclosure, the column separation device 117 may be a third vacuum window or a pressure limiting aperture. When the specimen chamber is not a high vacuum environment, but is filled with various gases 902a to form a specimen chamber of an environmental scanning electron microscope (ESEM), it is suitable for performing the opto-electro simultaneous detection or fast-switching detection on biological specimens or aqueous specimens. As shown in FIG. 9A, a third vacuum window 903a may be used to separate the column from the specimen chamber, and this window can maintain a high vacuum condition in the column while allowing the charged particle beam to pass through. The third window may be made of a material such as, but not limited to, silicon nitride membrane, silicon dioxide membrane, graphene film, and etc. As shown in FIG. 9B, one or more pressure limiting aperture 903b may be used to separate the column from the specimen chamber, and this pressure limiting aperture can simultaneously maintain a high vacuum condition in the column and a low vacuum condition in the specimen chamber.

Figure 10A:
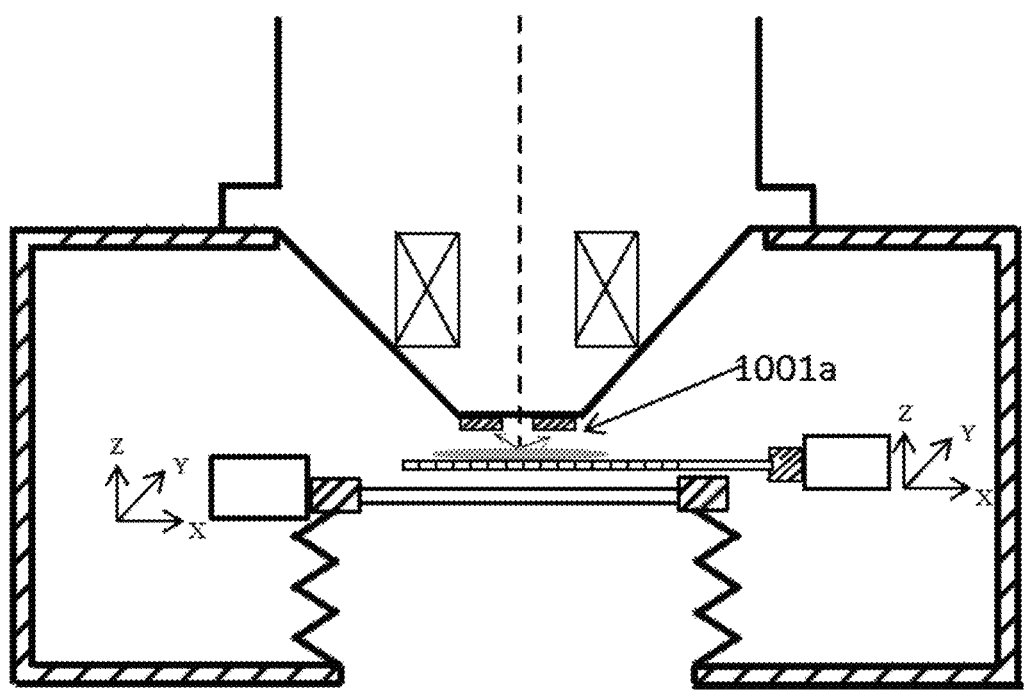
FIG. 10A is a diagram of a detection mode of a scanning electron microscope according to an embodiment of the disclosure.
Figure 10B:
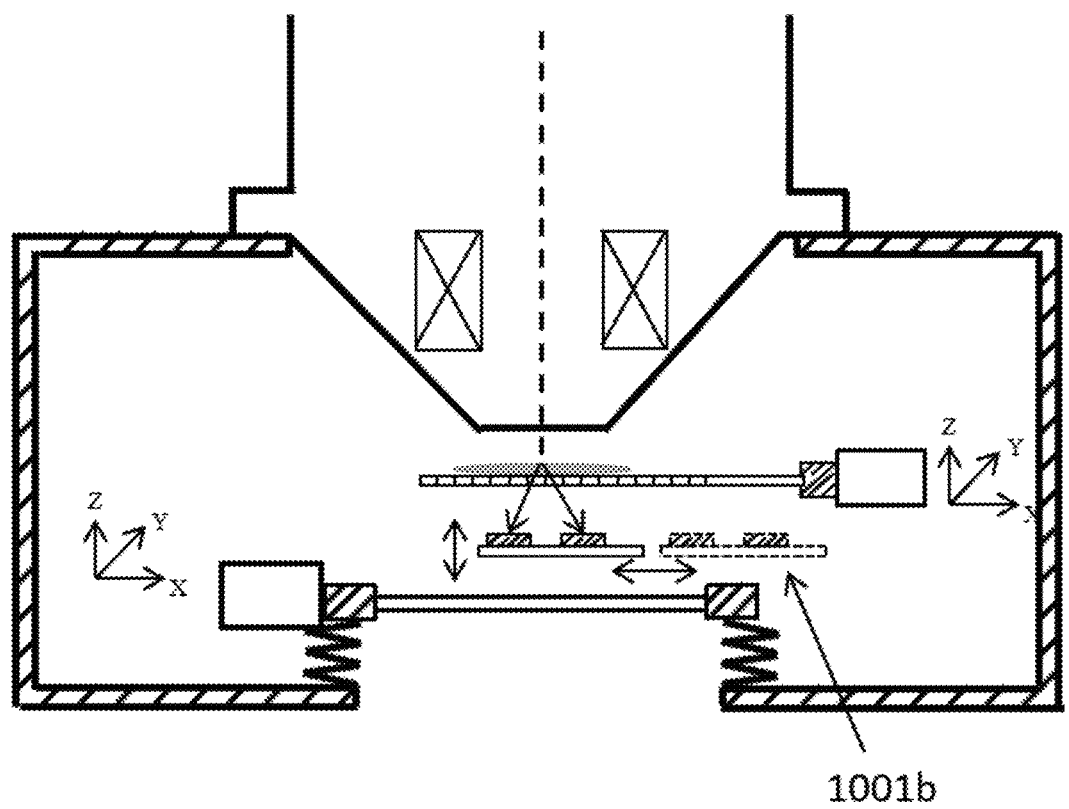
FIG. 10B is a diagram of another detection mode of the scanning electron microscope according to an embodiment of the disclosure.

According to aforementioned embodiment of the disclosure, when the charged particle system is an electron microscope, there are two detection modes: a scanning electron microscope mode with a secondary electron detector or a backscattered electron detector 1001a, as shown in FIG. 10A; and a scanning transmission electron microscope mode with a transmission electron detector, as shown in FIG. 10B, in which the transmission electron detector 1001b is movable, for example, the transmission electron detector, when in use, is moved to a position under the specimen by using the 3-dimensional moving platform, and moved away by using the 3-dimensional moving platform when it is not used; in addition, one can change the receiving angle of the transmission electrons by moving the 3-dimensional moving platform up and down.

Embodiment 7

Figure 11A:
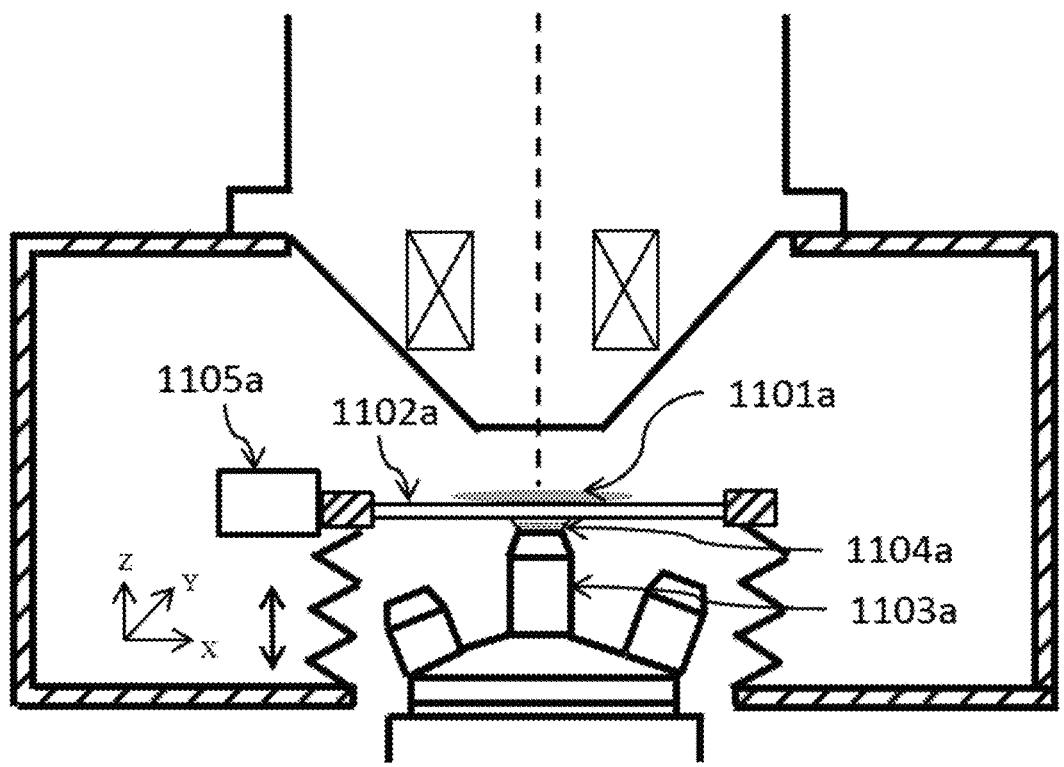
FIG. 11A is a diagram of implementation of specimen detection by using the optical system according to an embodiment of the disclosure.
Figure 11B:
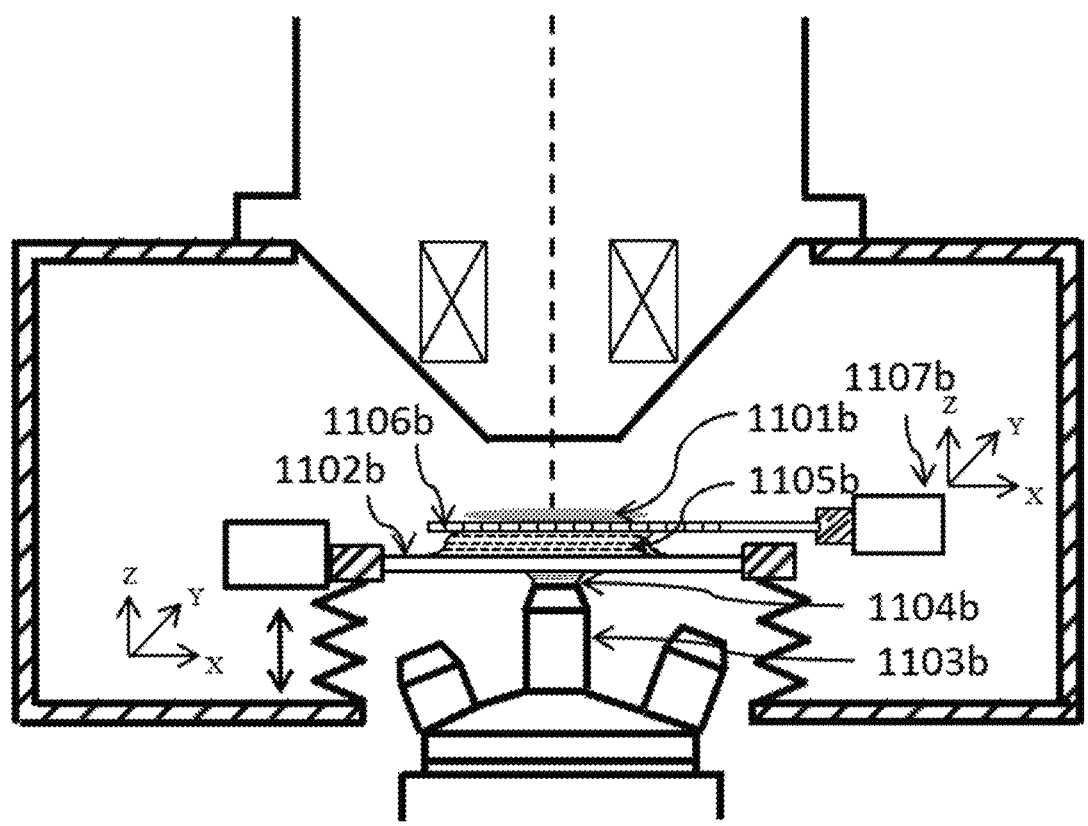
FIG. 11B is a diagram of another implementation of specimen detection by using the optical system according to an embodiment of the disclosure.

When the objective lens of the optical microscope is an oil immersion lens, the implementation of specimen detection by using the optical system is shown in FIG. 11. As shown in FIG. 11A, a specimen 1101a to be detected is placed on the movable vacuum window 1102a; at this time, the immersion oil 1104a and the vacuum window 1102a form the optical medium, such that the oil immersion lens 1103a can be used to observe the specimen 1101a. Thus, the optical detection of the specimen can be achieved through controlling the position of the specimen by 3-dimensional displacement platform 1105a. In FIG. 11B, the specimen 1101b is placed on the specimen holder 1106b, a kind of liquid with a high refractive index is filled between the specimen holder 1106b and the movable vacuum window 1102b, such as oil, lipid, vacuum grease, and etc.; at this time, the immersion oil 1104b, the vacuum window 1102b, the liquid 1105b, and the specimen holder 1106b form the optical medium, such that the oil immersion lens 1103a can be used to observe the specimen 1101a. Thus, the optical detection of the specimen can be achieved through controlling the position of the specimen by 3-dimensional displacement platform 1107b.

Embodiment 8

Figure 12:
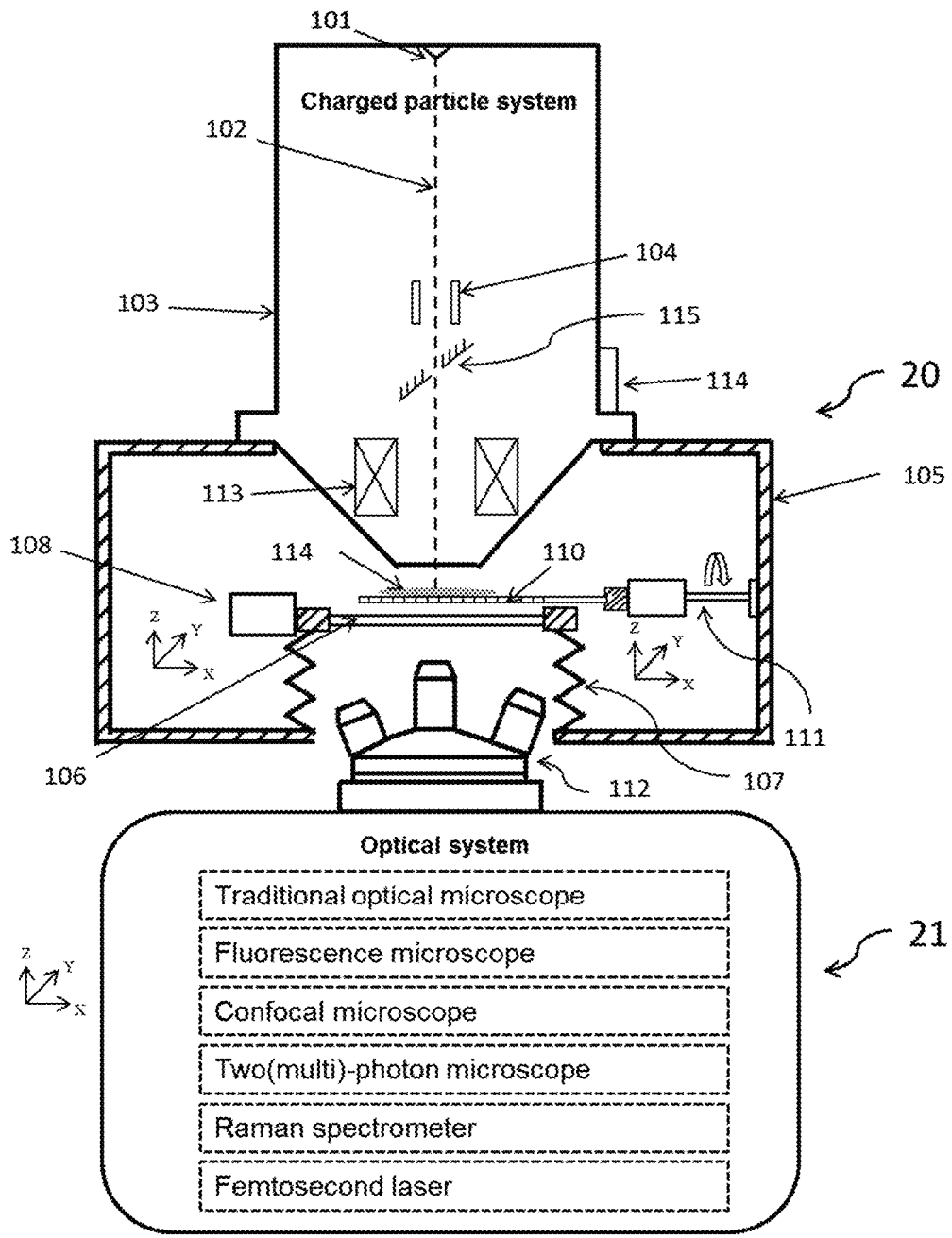
FIG. 12 is a diagram of an opto-electro simultaneous detection system according to an embodiment of the disclosure.

FIG. 12 is a diagram of an opto-electro simultaneous detection system according to embodiment 8 of the disclosure. The system includes a charged particle beam system 20 and an optical system 21.

The charged particle beam system 20 is anyone of charged particle beam system described in the six embodiments above.

The optical system 21 is located outside the specimen chamber of the charged particle beam system 20. The optical system 21 achieves the optical detection by, introducing light from the first window at a bottom of the specimen chamber and (or) the second window on the sidewall of the column, adjusting the position of the specimen, and focusing the light.

According to an embodiment of the disclosure, the optical system 21 includes at least one of: an optical microscope, a fluorescence microscope, a confocal microscope, two (multi)-photon microscope, a Raman spectrometer, and a femtosecond laser.

Figure 13A:
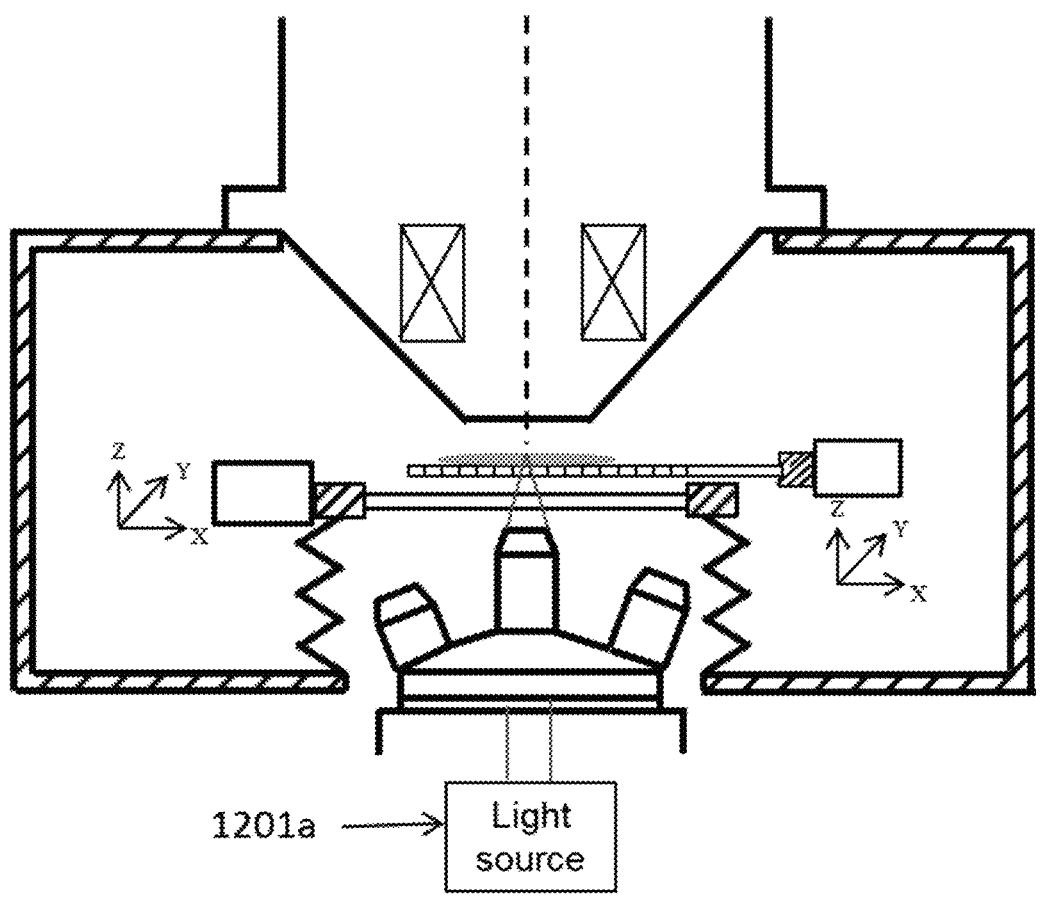
FIG. 13A is a diagram of an implementation of specimen detection by using the optical system and the charged particle beam system according to an embodiment of the disclosure.
Figure 13B:
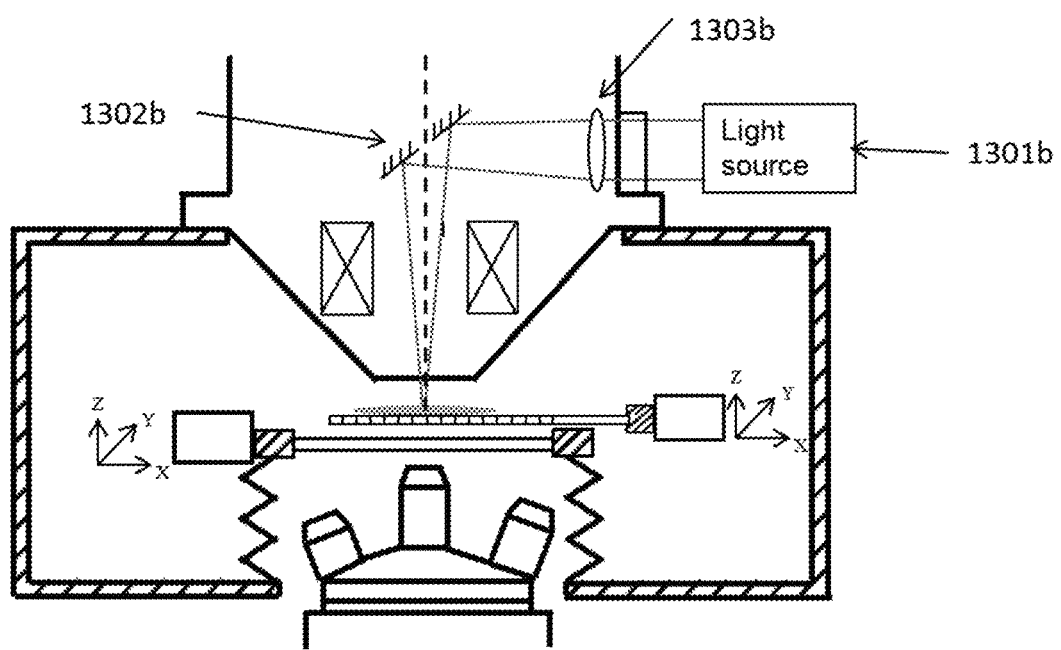
FIG. 13B is a diagram of an implementation of specimen detection by using the optical system and the charged particle beam system according to an embodiment of the disclosure.
Figure 13C:
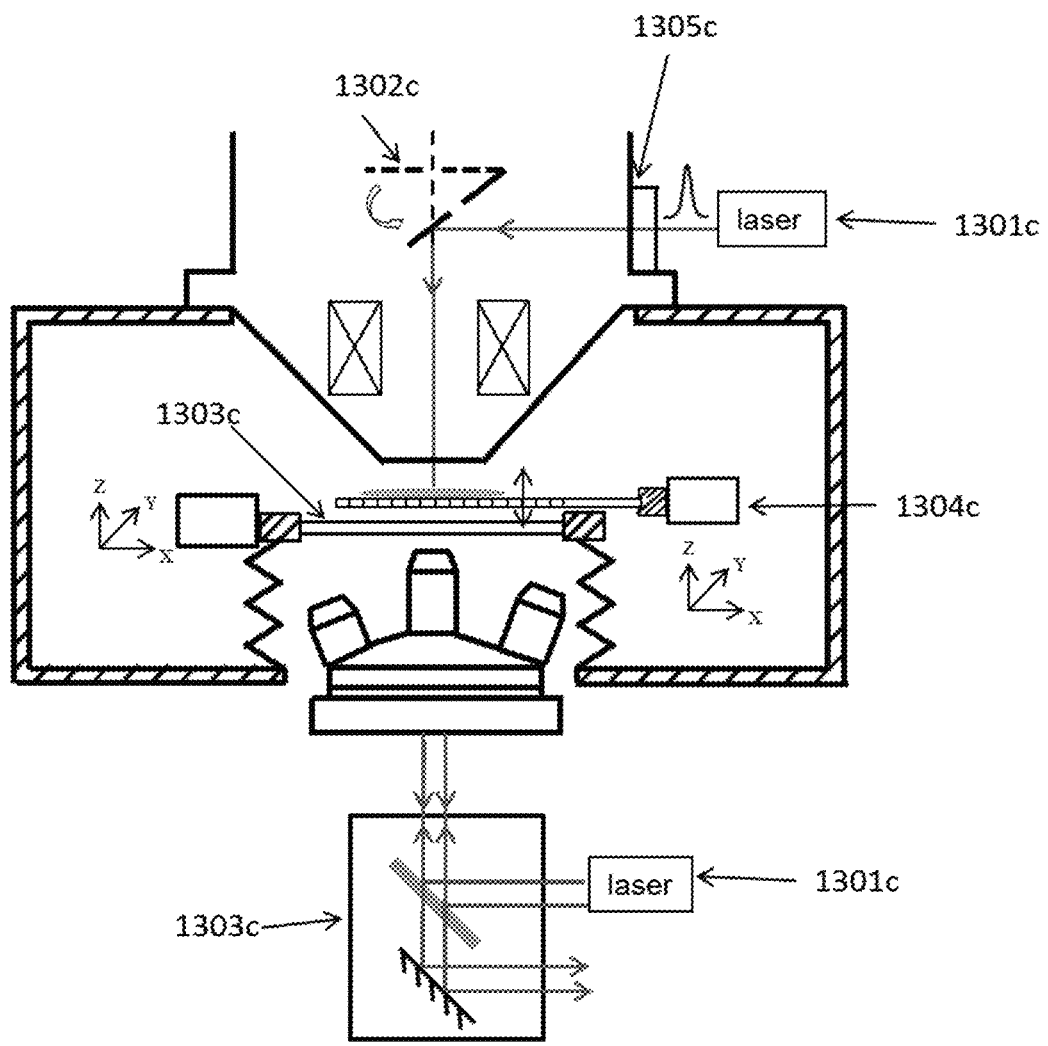
FIG. 13C is a diagram of an implementation of specimen detection by using the optical system and the charged particle beam system according to an embodiment of the disclosure.

FIG. 13 is a diagram of an implementation of specimen detection according to this embodiment. FIG. 13A shows the simultaneous detection of a thin specimen by the optical system in a reflective illumination mode and the charged particle beam system; FIG. 13B shows the simultaneous detection of the thin specimen by optical system in a transmission-type illumination mode and the charged particle beam system. The detection manner shown in FIG. 13A and FIG. 13B can be applied to find the target using a traditional optical microscope or find the fluorescence labeling using a fluorescence microscope, and then observe the details using a scanning electron microscope. Reference signs 1301a and 1301b may be a point light source, an area light source, such as a Light Emitting Diode (LED), a xenon lamp, a fiber illumination, and etc. In FIG. 13B, a first reflecting mirror 1302b is deployed in the column of the charged particle beam system, there is a hole at the center of the first reflecting mirror 1302b, through which the charged particle beam can pass through; the first reflecting mirror 1302b can also reflect the light generated from the light source to impinge the specimen, so as to achieve illumination detection of the specimen in a transmission-type mode; and a focusing lens 1303b is used to adjust the focusing length and the illumination scope. Besides the traditional optical microscope, the laser scanning confocal microscope (LSCM), two(multi)-photon microscope, Raman spectrometer, and pulse laser etc. usually use a laser beam, in this case as shown in FIG. 13C, the laser beam can enter the column from the second vacuum window 1305 at the side wall of the column, or from the optical lens set module 1303; there is a hole at the center of the second reflecting mirror 1302c, the second reflecting mirror 1302c can rotate around a fixed axis, when the second reflecting mirror 1302c is horizontal (shown as the dashed line in FIG. 13C), the electron beam can pass through the hole; when the angle between the second reflecting mirror 1302c and the optical axis of the charged particle beam system is 45°, the optical beam can be reflected by the second reflecting mirror 1302c and impinge the specimen along the optical axis, to detect or fabricate the specimen.

As shown in FIG. 13C a laser scanning confocal microscope is used to achieve 3-dimensional imaging by: introducing the laser beam to the specimen chamber from the first vacuum window at the bottom of the specimen chamber, and performing 2-dimensional scanning in the X and Y directions and a Z-direction scanning with aid of the 3-dimensional moving platform 1304c to achieve 3-dimensional imaging of the specimen.

With the design shown in FIG. 13C, a pulse laser beam can be introduced to the column of the charged particle beam system through the second vacuum window 1305c at the side wall of the column to fabricate the specimen, the displacement of the specimen is controlled by the 3-dimensional moving platform 1304c; at the same time one can observe the specimen by optical microscope in the reflective illumination mode under the charged particle beam system; after the pulse laser fabrication, the reflecting mirror 1302c can be rotated to the horizontal position to allow the charged particle beam to pass through the hole of the mirror and impinge the specimen; therefore, more precise fabrication can be done using the charged particle beam when the charge particle beam system is an focused ion beam (FIB) as an example; or achieve an image of the specimen when the charged particle beam system is a scanning electron microscope as an example.

In the embodiment of the disclosure, the structure shown in FIG. 13C may be a simultaneous system of the charged particle system and the Raman spectrometer; therefore the Raman spectrum of the specimen can be taken, and Raman imaging can also be achieved by controlling the movement of the specimen with the 3-dimensional moving platform 1304c; the Raman spectrometer is located below the specimen chamber, and light thereof can be introduced to the specimen chamber through the first vacuum window at the bottom of the chamber; the detection by the charged particle beam system can also be achieved at the same time.

In the embodiment of the disclosure, the structure shown in FIG. 13C may be a combined system of the charged particle beam system and the two(multi)-photon microscope, the laser beam may be introduced through the first vacuum window 1303c at the bottom of the specimen chamber or through the second vacuum window 1305c on the sidewall of the column.

In the embodiments above, in case of synchronous detection with the optical system and the charged particle beam system, the simultaneous focusing of the optical system and the charged particle beam system is done by cooperatively adjusting relative positions of the optical lens 112, the first vacuum window 106 and the specimen holder 111 in the vertical direction (the Z direction), together with adjusting the focal length of the focusing device 113 in the charged particle beam system, and finally the simultaneous focusing of optical and charged particle system is achieved to take the simultaneous detection of the specimen.

In the embodiment of the disclosure, since the optical system of the opto-electro simultaneous detection system is located outside the specimen chamber, there is enough space for manual or mechanical operation of the optical elements in the optical system, such as manually switching high/low power objective lens; and it is possible for the opto-electro simultaneous detection system to be compatible with multiple kinds of optical systems.

Embodiment 9

Figure 14:
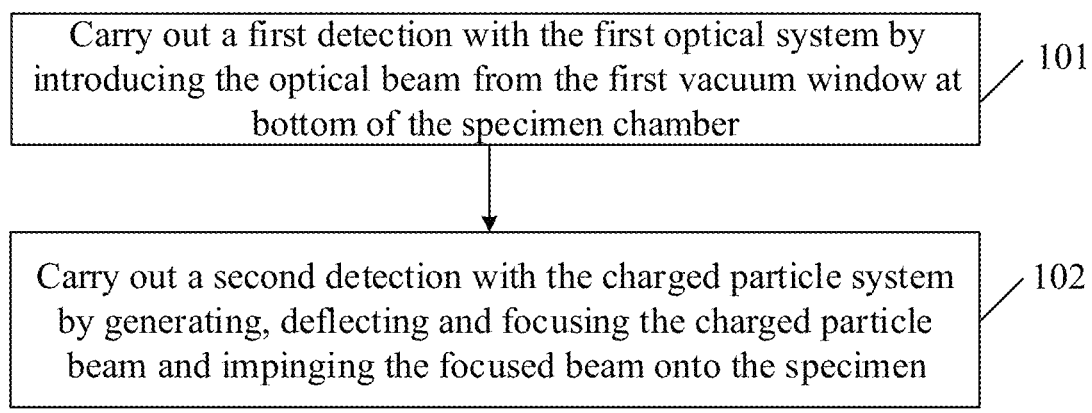
FIG. 14 is a flowchart of a method for implementing opto-electro simultaneous detection according to an embodiment of the disclosure.

Based on the opto-electro simultaneous detection system in the above embodiments, embodiment 9 provides a specimen detection method. As shown in FIG. 14, the method includes the following steps.

In Step 101, a first optical system introduces an optical beam into/out of a specimen chamber through a first vacuum window at the bottom of the specimen chamber as an optical beam propagation channel, to perform a first detection.

The first optical system may include at least one of a fluorescence microscope, a confocal microscope, a two (multi)-photon microscope, a raman spectrometer, femtosecond pulse laser, and etc.

The first detection may include at least one of positioning, scanning, measurement, and imaging.

Specifically, when the first optical system is a fluorescence microscope, the target with the fluorescent protein labeling is found out with the fluorescence microscope at first, and then the high resolution image is obtained with the scanning electron microscope. When the first optical system is a laser scanning module, the laser beam generated from the laser scanning module passes through the first vacuum window at the bottom of the specimen chamber of the charged particle beam system and impinges the specimen, and the 3-dimensional moving platform is moved to cause displacement of the specimen to control scanning of the specimen, thus achieving 3-dimensional confocal imaging. When the first optical system is a raman spectrometer, the laser beam generated from the raman spectrometer passes through the first vacuum window at the bottom of the specimen chamber of the charged particle beam system and impinges the specimen to generate a raman spectrum of the specimen, and the 3-dimensional moving platform is moved to cause displacement of the specimen to control scanning of the specimen, thus achieving measurement and imaging of the raman spectrum. At this time, the raman spectrometer is located under the specimen chamber, and performs measurement via the first vacuum window at the bottom of the specimen chamber; the detection with the charged particle beam system can also be done at the same time; or when fabricating the specimen a with femtosecond laser, reflective illumination detection may be performed on the specimen by the optical microscope below the charged particle beam system; after the fabrication, the reflecting mirror 302c is rotated to the horizontal position to allow the charged particle beam in the charged particle beam system to pass, and the high resolution imaging is achieved with the scanning electron microscope.

In Step 102, the charged particle beam generated from charged particle beam system is deflected and focused and then impinges the specimen, and at least one the position of the first vacuum window and the position of the specimen is adjusted, thus achieving a second detection of the specimen.

The second detection may include at least one of positioning, scanning, imaging and fabrication.

In the embodiment of the disclosure, the charged particle beam system may further include the movement control device connected to the specimen holder; accordingly, when the specimen is thick or opaque, the method further includes the following steps between Step 101 and Step 102.

In Step 101', rotating the movement control device connected to the specimen holder to rotate the specimen by an angle of 180° around the axis of the movement control device.

Specifically, the specimen is located under the specimen holder in Step 101; after Step 101', the movement control device connected to the specimen holder is rotated under control, to rotate the specimen by an angle of 180° around the axis of the movement control device, and then go to Step 102.

The movement control device connected to the specimen holder may rotate the specimen through a rotation device.

The rotation axis of the movement control device intersects perpendicularly with the optical axis of the charged particle beam system. In this way, the optical detection center before rotation coincides with the charged particle beam detection center after the rotation.

In the embodiment of the disclosure, when the specimen to be detected by the first optical system need to be fabricated by the femtosecond laser, before Step 101, the method further includes Step 100.

In Step 100, the laser beam generated from the second optical system enters the column of the charged particle beam system through the second vacuum window on the sidewall of the column, and then the laser beam is reflected by the second reflecting mirror to impinge the specimen to fabricate the specimen;

The second optical system is a femtosecond pulse laser.

What are described above are merely embodiments of the disclosure, and are not intended to limit the scope of protection of the disclosure.

INDUSTRIAL APPLICABILITY

With the opto-electro simultaneous detection system, as well as the method for opto-electro simultaneous or fast-switching detection, a specimen in the charged particle specimen chamber can be detected by the charged particle system and the optical system. Since the optical system of the opto-electro simultaneous detection system is located outside the specimen chamber, there is enough space for manual operation of the optical device, such as manually switching objective lens; and it is possible to be compatible with multiple kinds of optical system. when the specimen is thick or opaque, firstly, the specimen is rotated to be under the specimen holder to be observed with the optical system through the first vacuum window; secondly, the movement control device connected to the specimen holder is rotated to rotate the specimen by an angel of 180° around the axis, and the specimen is detected with the charged particle beam system. The rotation axis intersects perpendicularly with the optical axis of the charged particle beam system; in this way the optical detection center before rotation coincides with the charged particle detection center after the rotation.

The invention claimed is:

1. A charged particle beam system, comprising: a particle source, a column, a specimen chamber with a first vacuum window, a dynamic sealing device, and a first displacement device; wherein
the particle source is configured to generate a charged particle beam for impinging a specimen to be detected placed on the first vacuum window of the specimen chamber;
the column comprises a deflecting device for deflecting the charged particle beam and a focusing device for focusing the charged particle beam,
the dynamic sealing device is configured to connect, through a metal bellows, the first vacuum window and an outer wall of the specimen chamber;
the first vacuum window is located at the bottom of the specimen chamber and acts as an optical beam propagation channel to introduce an optical beam from or out to an optical system located outside both the column and the specimen chamber of the charged particle beam system to carry out a detection of the specimen; and
the first displacement device is connected to the first vacuum window to adjust, through a three-dimensional displacement platform, a position of the first vacuum window in all three directions.

2. The charged particle beam system according to claim 1, further comprising a specimen holder for supporting the specimen.

3. The charged particle beam system according to claim 2, further comprising: a movement control device for translating or overturning the specimen holder.

4. The charged particle beam system according to claim 1, wherein a second vacuum window is deployed on a sidewall of the column, and is configured to introduce an external optical beam to the column.

5. The charged particle beam system according to claim 1, further comprising a first reflecting mirror with a hole at a center of the first reflecting mirror and located on the optical axis of the system, wherein an angle between the first reflecting mirror and the optical axis is 45°; and the charged particle beam passes through the hole before impinging the specimen.

6. The charged particle beam system according to claim 4, further comprising a second reflecting mirror with a hole at a center of the second reflecting mirror, the second mirror can rotate about a fixed axis, when an angle between the second vacuum mirror and the optical axis is 90°, the charged particle beam can pass through the hole and impinge the specimen.

7. The charged particle beam system according to claim 3, wherein a rotation axis of the movement control device perpendicularly intersects with an optical axis of the system.

8. The charged particle beam system according to claim 2, wherein the specimen holder is a transparent and uniform thin plate with or without an array of holes.

9. The charged particle beam system according to claim 1, further comprising: a second charged particle detector or a back scattered charged particle detector located under the column; or a movable scanning transmission charged particle detector located under the specimen to be detected.

10. The charged particle beam system according to claim 1, wherein a third window or a pressure limiting aperture is deployed at bottom of the column, and is configured to maintain a pressure difference between the column and the specimen chamber.

11. An opto-electro simultaneous detection system, comprising:
a charged particle beam system; and
an optical system, located outside both a column and a specimen chamber of the charged particle beam system, wherein the optical system detects a specimen through a first vacuum window,
wherein the charged particle beam system comprises a particle source, the column, the specimen chamber with the first vacuum window, a dynamic sealing device, and a first displacement device;
wherein
the particle source is configured to generate a charged particle beam for impinging the specimen to be detected placed on the first vacuum window of the specimen chamber;
the column comprises a deflecting device for deflecting the charged particle beam and a focusing device for focusing the charged particle beam;
the dynamic sealing device is configured to connect, through a metal bellows, the first vacuum window and an outer wall of the specimen chamber;
the first vacuum window is located at the bottom of the specimen chamber and acts as an optical beam propagation channel to introduce an optical beam from or out to an optical system located outside both the column and the specimen chamber of the charged particle beam system to carry out a detection of the specimen; and
the first displacement device is connected to the first vacuum window to adjust, through a 3-dimension displacement platform, a position of the first vacuum window in all three directions.

12. An opto-electro simultaneous detection method, comprising:
introducing, by a first optical system, an optical beam into or out of a specimen chamber through a first vacuum window, as an optical beam propagation channel, at bottom of the specimen chamber, to carry out a first detection of a specimen placed on the first vacuum window; and
generating, by a charged particle beam system, a charged particle beam, which is deflected and focused and then impinges the specimen, and adjusting at least one of a position of the first vacuum window and a position of the specimen, to carry out a second detection of the specimen, wherein the position of the first vacuum window is adjusted by a 3-dimension displacement platform, in a first displacement device, in all three directions;
wherein the first optical system is located outside both a column and a specimen chamber of the charged particle beam system; and
wherein the first vacuum window and an outer wall of the specimen chamber are connected through a dynamic sealing device in the charged particle beam system, the dynamic sealing device having a structure of a metal bellows.

13. The method according to claim 12, wherein each the first detection and the second detection comprises: positioning, measurement, scanning, imaging, and fabrication of the specimen.

14. The method according to claim 12, wherein after the first detection of the specimen with the first optical system, the method further comprises:
overturning a specimen holder by a movement control device connected to the specimen holder, such that the specimen is rotated by an angle of 180° about a rotation axis of the movement control device and a second detection center after the overturn coincides with a first detection center before the overturn.

15. The method according to claim 12, wherein the method further comprises:
generating, by a second optical system, an optical beam, which enters the column of the charged particle beam system through a second vacuum window on a side wall of the column, and is then deflected by a second reflecting mirror to impinge the specimen, to fabricate the specimen.

16. The method according to claim 12, wherein impinging the specimen by the charged particle beam comprises: impinging the specimen with the charged particle beam passing through a hole at a center of the first reflecting mirror located at an optical axis of the charged particle system; wherein an angle between the first reflecting mirror and the optical axis is 45°.

17. The method according to claim 12, wherein the method further comprises: causing the optical beam generated by the first optical system to enter the column of the charged particle beam system through a second vacuum window on a side wall of the column and then to be deflected by the first reflecting mirror to impinge the specimen, so as to illuminate the specimen.

18. The method according to claim 15, wherein impinging the specimen by the charged particle beam comprises:
impinging the specimen with the charged particle beam passing through a hole at a center of the second reflecting mirror located at an optical axis of the charged particle system; wherein an angle between the second reflecting mirror and the optical axis is 90°.

* * * * *